United States Patent
Yu et al.

(10) Patent No.: US 12,451,446 B2
(45) Date of Patent: Oct. 21, 2025

(54) RFLDMOS DEVICE AND MANUFACTURING METHOD THEREOF

(71) Applicant: Shanghai Huahong Grace Semiconductor Manufacturing Corporation, Shanghai (CN)

(72) Inventors: Han Yu, Shanghai (CN); Jinming Zhang, Shanghai (CN); Bing Li, Shanghai (CN)

(73) Assignee: SHANGHAI HUAHONG GRACE SEMICONDUCTOR MANUFACTURING CORPORATION, Shanghai (CN)

( * ) Notice: Subject to any disclaimer, the term of this patent is extended or adjusted under 35 U.S.C. 154(b) by 532 days.

(21) Appl. No.: 17/983,788

(22) Filed: Nov. 9, 2022

(65) Prior Publication Data
US 2023/0187385 A1    Jun. 15, 2023

(30) Foreign Application Priority Data
Dec. 13, 2021 (CN) .......................... 202111520626.1

(51) Int. Cl.
*H01L 23/60* (2006.01)
*H01L 23/66* (2006.01)
(Continued)

(52) U.S. Cl.
CPC .............. *H01L 23/60* (2013.01); *H01L 23/66* (2013.01); *H10D 30/0281* (2025.01);
(Continued)

(58) Field of Classification Search
CPC ........... H10D 30/0281; H10D 30/0221; H10D 30/603; H10D 30/655; H10D 62/371;
(Continued)

(56) References Cited

U.S. PATENT DOCUMENTS

| | | | | |
|---|---|---|---|---|
| 6,445,019 B2 * | 9/2002 | Van Dalen | ........... | H10D 64/117 |
| | | | | 257/E29.328 |
| 6,465,845 B1 * | 10/2002 | Baek | ................... | H10D 62/151 |
| | | | | 257/E29.268 |

(Continued)

FOREIGN PATENT DOCUMENTS

| | | | |
|---|---|---|---|
| CN | 102280482 A | | 12/2011 |
| CN | 103872123 A | | 6/2014 |

(Continued)

OTHER PUBLICATIONS

Search Report from Chinese Patent Office for Application No. 2021115206261 dated Oct. 30, 2024.

(Continued)

*Primary Examiner* — Maliheh Malek
(74) *Attorney, Agent, or Firm* — Harris Beach Murtha Cullina PLLC

(57) ABSTRACT

The present disclosure provides an RFLDMOS device and a manufacturing method thereof, by an etching process of adding dielectric layers between the Faraday shielding covers, interconnection of the multiple layers of Faraday shielding covers is realized, solving the problem that a parasitic resistance of a Faraday shielding cover may easily cause a greater feedback capacitance and introduce nonlinearity at a high frequency. The feedback capacitance and linearity of the RFLDMOS device at a high frequency are improved, and the broadband performance of the RFLDMOS device is improved.

10 Claims, 5 Drawing Sheets

(51) Int. Cl.
*H10D 30/01* (2025.01)
*H10D 30/65* (2025.01)
*H01L 23/522* (2006.01)
*H10D 64/00* (2025.01)

(52) U.S. Cl.
CPC ......... *H10D 30/65* (2025.01); *H01L 23/5225* (2013.01); *H01L 2223/6616* (2013.01); *H10D 64/112* (2025.01)

(58) Field of Classification Search
CPC .... H10D 64/111; H10D 64/27; H10D 64/516; H10D 30/65; H10D 64/256; H10D 64/112; H01L 23/60; H01L 23/66; H01L 2223/6616; H01L 23/5225; H01L 23/552
See application file for complete search history.

(56) References Cited

U.S. PATENT DOCUMENTS

| | | | | |
|---|---|---|---|---|
| 6,746,928 | B1* | 6/2004 | Schuegraf | H10D 10/021 438/258 |
| 6,939,781 | B2* | 9/2005 | Redd | H10D 30/0614 257/E21.453 |
| 6,992,338 | B1* | 1/2006 | Yin | H10D 84/038 257/555 |
| 7,279,744 | B2* | 10/2007 | Gammel | H10D 64/20 257/E29.112 |
| 7,473,976 | B2* | 1/2009 | Kocon | H10D 8/60 257/354 |
| 7,820,517 | B2* | 10/2010 | Gammel | H10D 64/111 438/301 |
| 7,989,879 | B2* | 8/2011 | Van Rijs | H10D 64/111 257/E29.256 |
| 8,173,510 | B2* | 5/2012 | Denison | H10D 30/658 257/330 |
| 8,664,718 | B2* | 3/2014 | Cheng | H10D 64/111 257/E29.256 |
| 8,680,615 | B2* | 3/2014 | Mitra | H10D 30/0293 257/340 |
| 9,059,277 | B2* | 6/2015 | Li | H10D 30/603 |
| 9,136,350 | B2* | 9/2015 | Zhou | H10D 62/371 |
| 9,437,693 | B2* | 9/2016 | Gao | H10D 62/834 |
| 9,520,367 | B2* | 12/2016 | Gao | H10D 30/0281 |
| 9,543,431 | B2* | 1/2017 | Yu | H10D 64/111 |
| 9,590,053 | B2* | 3/2017 | Chou | H01L 21/761 |
| 9,666,710 | B2* | 5/2017 | Gao | H10D 62/103 |
| 9,871,132 | B1* | 1/2018 | Liu | H10D 30/0212 |
| 10,192,983 | B2* | 1/2019 | Imthurn | H10D 84/151 |
| 10,756,208 | B2* | 8/2020 | Lu | H10D 30/65 |
| 11,056,587 | B2* | 7/2021 | Shin | H10D 62/116 |
| 2005/0156234 | A1* | 7/2005 | Gammel | H10D 30/603 257/E29.112 |
| 2005/0191815 | A1* | 9/2005 | Shibib | H10D 64/111 438/303 |
| 2006/0113601 | A1* | 6/2006 | Shibib | H10D 64/111 257/E29.264 |
| 2006/0113625 | A1* | 6/2006 | Bude | H10D 62/371 257/493 |
| 2009/0267145 | A1* | 10/2009 | Pearce | H10D 62/151 438/286 |
| 2011/0266620 | A1* | 11/2011 | Terrill | H10D 64/111 438/286 |
| 2012/0228704 | A1* | 9/2012 | Ju | H10D 30/65 257/E29.256 |
| 2013/0146973 | A1* | 6/2013 | Mitra | H10D 64/111 257/E21.24 |
| 2014/0042522 | A1* | 2/2014 | Li | H01L 29/402 438/286 |
| 2014/0042538 | A1* | 2/2014 | Li | H10D 30/0281 438/286 |
| 2014/0131796 | A1* | 5/2014 | Zhou | H10D 62/371 438/286 |
| 2014/0231911 | A1* | 8/2014 | Kim | H10D 64/111 438/286 |
| 2015/0144953 | A1* | 5/2015 | Hill | H10D 30/015 438/172 |
| 2015/0340448 | A1* | 11/2015 | Babcock | H10D 62/83 257/340 |
| 2016/0056114 | A1* | 2/2016 | Gao | H01L 21/30604 257/659 |
| 2016/0149007 | A1* | 5/2016 | Chou | H10D 64/111 257/339 |
| 2016/0181378 | A1* | 6/2016 | Gao | H10D 64/111 438/286 |
| 2016/0190310 | A1* | 6/2016 | Yu | H10D 64/112 438/286 |
| 2016/0254380 | A1* | 9/2016 | Gao | H10D 30/0221 438/286 |
| 2016/0343851 | A1* | 11/2016 | Gao | H10D 30/0281 |
| 2017/0352731 | A1* | 12/2017 | Kuo | H10D 30/0212 |
| 2019/0288066 | A1* | 9/2019 | Lee | H10D 30/0221 |
| 2019/0288112 | A1* | 9/2019 | Wang | H10D 30/65 |
| 2020/0013880 | A1* | 1/2020 | Ho | H01L 23/60 |
| 2020/0083370 | A1* | 3/2020 | Renaud | H01L 29/404 |
| 2021/0242343 | A1* | 8/2021 | Snyder | H10D 62/393 |

FOREIGN PATENT DOCUMENTS

CN 108365009 A 8/2018
WO 2018009543 A1 1/2018

OTHER PUBLICATIONS

Second Office Action issued by Chinese Patent Office (CNIPA) for application no. 2021115206261 dated Apr. 17, 2025 (no translation provided).
Second Search Report issued by Chinese Patent Office (CNIPA) for application No. 2021115206261 dated Apr. 14, 2025 (translation provided).

* cited by examiner

RFLDMOS DEVICE AND MANUFACTURING METHOD THEREOF

CROSS-REFERENCES TO RELATED APPLICATIONS

This application claims priority to Chinese Patent Application No. CN 202111520626.1 filed at CNIPA on Dec. 13, 2021, the disclosure of which is incorporated herein by reference in its entirety.

TECHNICAL FIELD

The present disclosure relates to the technical field of semiconductor manufacturing, in particular to an RFLDMOS device and a manufacturing method thereof.

BACKGROUND

An RFLDMOS (Radio Frequency Laterally Diffused Metal Oxide Semiconductor) is a radio frequency power device, which has the characteristics of high gain, high linearity, high voltage resistance, high output power, etc., and is widely applied to the fields of radio frequency base stations, wireless broadcast stations, radars, etc. Power array and multi-chip synthesis are adopted, and output power of the product may reach more than 500 W.

An on-resistance and an output capacitance are main factors affecting the efficiency of the RFLDMOS. Reducing the on-resistance and the output capacitance may reduce power loss caused by both, thereby improving the efficiency and gain of the device. By reducing a gate-source capacitance and a feedback capacitance, the characteristic frequency, the highest oscillation frequency and the gain of the device may be effectively improved.

In the RFLDMOS device, a Faraday shielding cover is utilized to shield a gate, so as to reduce a feedback capacitance Cgd between a drain and the gate. However, at the same time, a parasitic resistance of the Faraday shielding cover may affect the feedback capacitance Cgd. FIG. 1 shows frequency and feedback capacitance (Cgd) curves of a prior art RFLDMOS device; a parasitic resistance corresponding to a curve 101 is 0 ohm, a parasitic resistance corresponding to a curve 102 is 10 ohm, a parasitic resistance corresponding to a curve 103 is 20 ohm, a parasitic resistance corresponding to a curve 104 is 40 ohm, and a parasitic resistance corresponding to a curve 105 is 100 ohm. It can be seen from the figure that with the increase of the parasitic resistance of the Faraday shielding cover, the feedback capacitance Cgd also gradually increases, and especially at a high frequency, the parasitic resistance has greater influence on the feedback capacitance Cgd. In addition, a square resistance of the Faraday shielding cover has a great influence on post-DPD linearity, and a larger parasitic resistance of the Faraday shielding cover may cause nonlinearity of the frequency and the feedback capacitance Cgd, as shown by the curve 105. Therefore, the parasitic resistance of the Faraday shielding cover is an extremely important factor for determining the radio frequency performance of the RFLDMOS at high frequencies.

SUMMARY

In view of this, the present disclosure provides an RFLDMOS device and a manufacturing method thereof, which are used to reduce a parasitic resistance of a Faraday shielding cover of a prior RFLDMOS device.

The present disclosure provides a manufacturing method of an RFLDMOS device, including the steps as follows:

step 1: providing a substrate, where an epitaxial layer is arranged on the substrate, and a drift region and a body region are arranged in the epitaxial layer; a drain region is arranged in the drift region; a heavily doped region and a source region are arranged in the body region; a polysilicon gate is arranged on the surface of the epitaxial layer; a metal silicide is arranged on the surface of the polysilicon gate, the source region, and the drain region;

step 2: depositing, above the epitaxial layer, a first layer of a dielectric layer and a first layer of a Faraday shielding layer in sequence;

step 3: etching, by utilizing a photolithographic and an etching process, the first layer of a Faraday shielding layer to form a first layer of a Faraday shielding cover;

step 4: depositing a second layer of a dielectric layer, and removing, by utilizing the photolithographic and etching processes, part of the second layer of a dielectric layer covering the first layer of a Faraday shielding cover, so as to expose part of the first layer of a Faraday shielding cover;

step 5: depositing a second layer of a Faraday shielding layer, and forming, by utilizing the photolithographic and etching processes, a second layer of a Faraday shielding cover, where the first layer of a Faraday shielding cover and the second layer of a Faraday shielding cover form an interconnection structure;

step 6: depositing a metal front dielectric layer, opening, by photolithography and dry etching, the metal front dielectric layer, and further etching the epitaxial layer to form a deep trench, where the bottom of the deep trench is located in the substrate;

step 7: etching a contact hole, and depositing a metal to form a sinking channel and the contact hole; and step 8: forming and etching a first metal layer, and connecting with the contact hole and the sinking channel.

Preferably, the substrate in step 1 is N-type, or the substrate is P-type.

Preferably, the polysilicon gate in step 1 includes a gate oxide layer, a polysilicon and a spacer.

Preferably, the first layer of a dielectric layer in step 2 and the second layer of a dielectric layer in step 4 are silicon oxides.

Preferably, the first layer of a Faraday shielding layer in step 2 and the second layer of a Faraday shielding layer in step 5 are composed of a stack of a titanium metal layer, a titanium nitride layer and a tungsten metal layer.

Preferably, the first layer of a Faraday shielding cover in step 3 is located above the drift region outside the side of the drain region of the polysilicon gate and covers the side of the polysilicon gate.

Preferably, the second layer of a Faraday shielding cover in step 5 extends over the polysilicon gate to the upper side of part of the body region and the drift region.

Preferably, the metal deposited in step 7 is tungsten.

Preferably, the method is also suitable for forming an RFLDMOS device having more than two layers of a Faraday shielding cover interconnection structure.

The present disclosure further provides an RFLDMOS device, including:

a substrate;

an epitaxial layer located above the substrate; where a drift region and a body region are arranged in the epitaxial layer; a drain region is arranged in the drift region, a heavily doped region and a source region are arranged in the body region, and the heavily doped region is connected with the source region;

a polysilicon gate located on the surface of the epitaxial layer, where the polysilicon gate includes a gate oxide layer, a polysilicon and a spacer;

a metal silicide on the surface of the source region, the drain region and the polysilicon gate;

Faraday shielding covers;

a sinking channel and a contact hole, where the bottom of the sinking channel is located in the substrate and penetrates through the body region and the epitaxial layer; and a first metal layer connected with the sinking channel and the contact hole;

where the Faraday shielding covers are located above the polysilicon gate and are divided into upper and lower layers, and the first layer of a Faraday shielding cover is located above the polysilicon gate, with a dielectric layer therebetween; a second layer of a Faraday shielding cover is located above the first layer of a Faraday shielding cover, and besides an isolated dielectric layer, an interconnection structure is also formed therebetween.

According to the invention, an RFLDMOS device having multiple layers of Faraday shielding covers is improved; by an etching process of adding dielectric layers between the Faraday shielding covers, interconnection of the multiple layers of Faraday shielding covers is realized, such that parasitic resistances of the Faraday shielding covers are greatly reduced, feedback capacitance and linearity of the RFLDMOS device at high frequencies are improved, and broadband performance of the RFLDMOS device is enhanced; moreover, the multiple layers of Faraday shielding covers are interconnected, so that metal wiring is simpler, and the efficiency is improved.

BRIEF DESCRIPTION OF THE DRAWINGS

The foregoing and other objects, features and advantages of the present disclosure will become more apparent from the following description of embodiments of the present disclosure with reference to the accompanying drawings, in which.

DESCRIPTION OF REFERENCE NUMERALS

101—substrate; 102—epitaxial layer; 103—drift region; 104—body region; 105—gate dielectric layer; 106—polysilicon; 107—heavily doped region; 108—source region; 109—drain region; 110—metal silicide; 111—first layer of Faraday shielding cover; 112—first layer of dielectric layer; 113—second layer of Faraday shielding cover; 114—second layer of dielectric layer; 115—metal front dielectric layer; 116—sinking channel; 117—contact hole; 118—metal layer; 119—third layer of Faraday shielding cover; 120—third layer of dielectric layer.

DETAILED DESCRIPTION

The present disclosure is described below based on the embodiments, but the present disclosure is not limited thereto. In the following detailed description of the present disclosure, certain specific details are described in detail. The present disclosure may be fully understood by those skilled in the art without the description of these detailed parts. In order to avoid confusing the substance of the present disclosure, well-known methods, processes, flows, elements, and circuits have not been described in detail.

In addition, it should be understood by those of ordinary skill in the art that the drawings provided herein are for illustrative purposes, and the drawings are not necessarily drawn to scale.

Unless the context clearly requires otherwise, similar words such as "including" and "containing" throughout the application document should be interpreted as inclusive rather than exclusive or exhaustive; that is to say, it means "including but not limited to."

In the description of the present disclosure, it should be understood that the terms "first" and "second" are only used for descriptive purposes, and cannot be understood as indicating or implying relative importance. In addition, in the description of the invention, unless otherwise stated, "multiple" means two or more.

Figure 1:
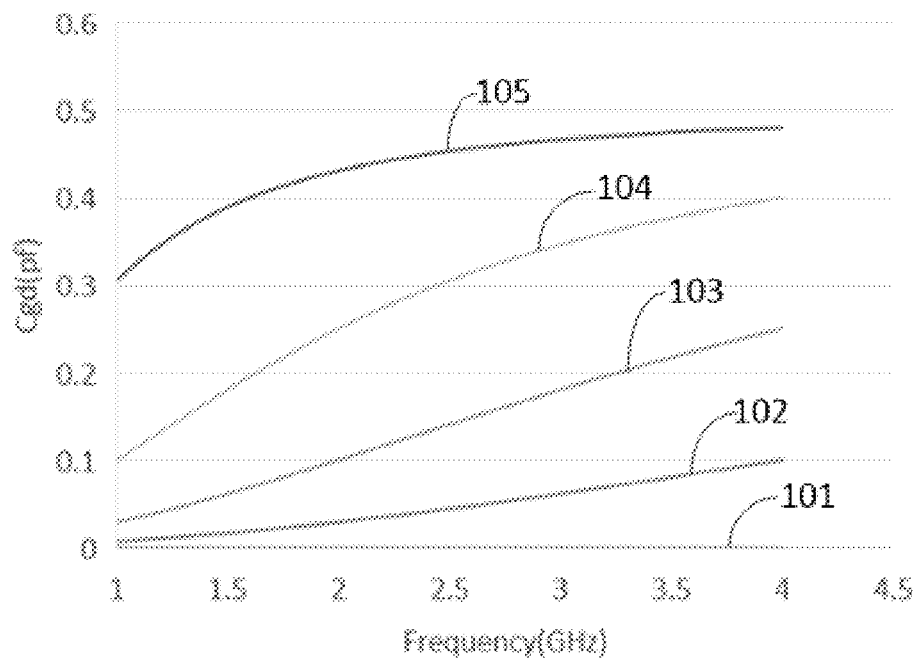
FIG. 1 shows frequency and feedback capacitance curves of a prior art RFLDMOS device.
Figure 2:
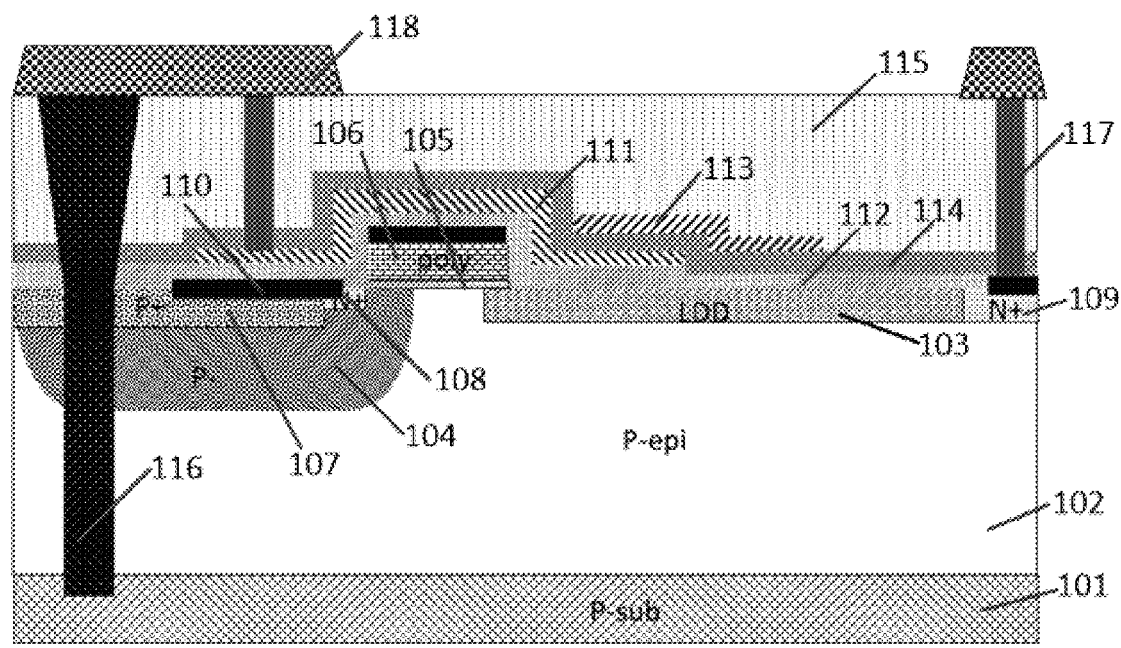
FIG. 2 is a structural schematic diagram of a prior art RFLDMOS device having two layers of Faraday shielding covers.

At present, dielectric layers are arranged among layers of Faraday shielding covers of prior RFLDMOS devices, and Faraday shielding covers are connected in a manner of using a metal to connect the several layers of Faraday shielding covers with a source region, a drain region and a substrate. As shown in FIG. 2, it is a structural schematic diagram of a prior art RFLDMOS device having two layers of Faraday shielding covers. The Faraday shielding cover structure is divided into upper and lower layers, with a dielectric layer 114 between a second layer of a Faraday shielding layer 113 and a first layer of a Faraday shielding cover 111. The Faraday shielding covers are connected to a metal layer 118 through a contact hole 117. Based on the prior art structure and connection mode of Faraday shielding covers, the present disclosure provides an RFLDMOS device and a manufacturing method thereof, which are used to reduce parasitic resistances of Faraday shielding covers and improve the frequency characteristics of the RFLDMOS device at high frequencies. The technical solution of the present disclosure is further described by the specific embodiments in conjunction with the drawings.

Figure 3:
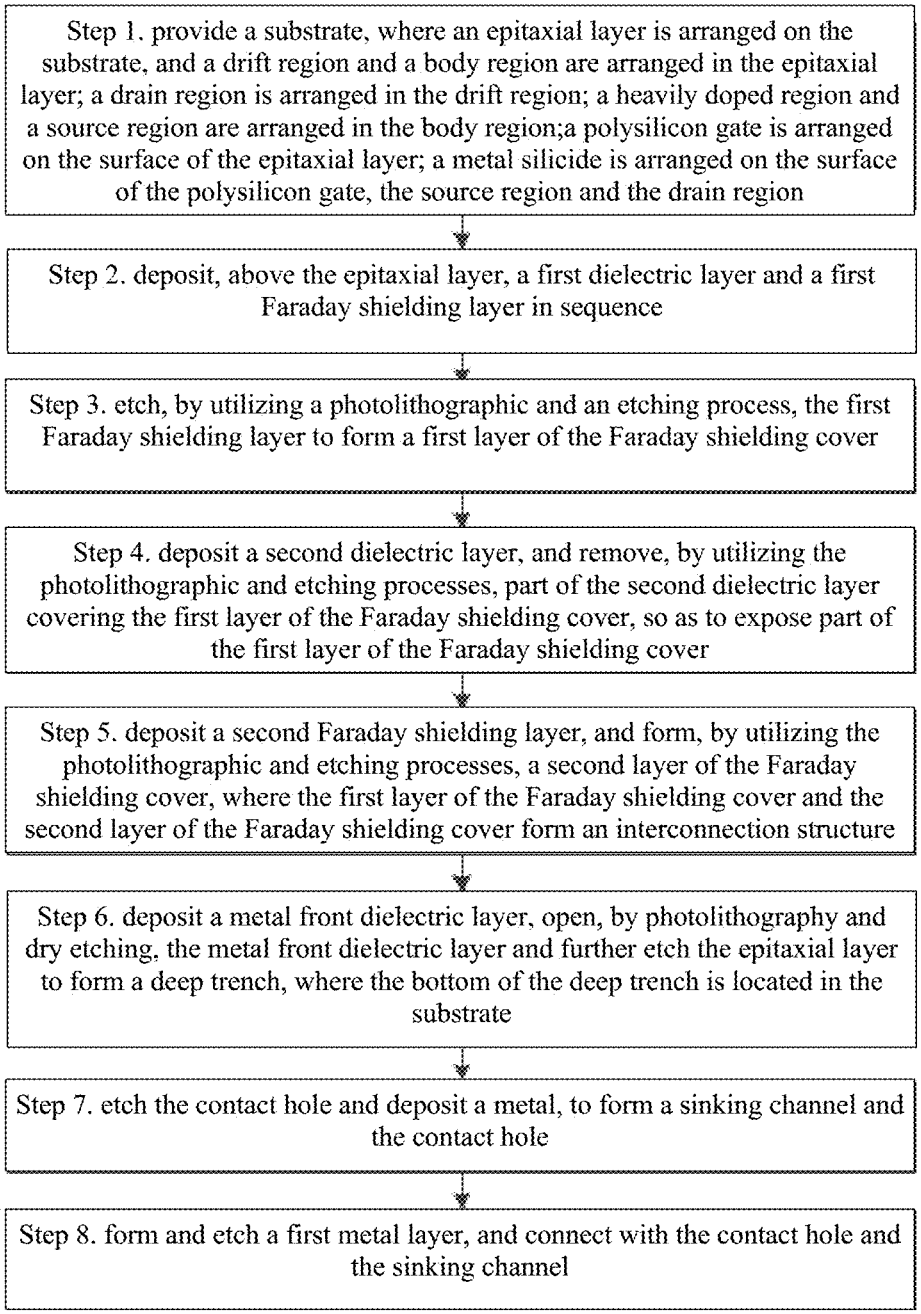
FIG. 3 is a flow chart of a manufacturing method of an RFLDMOS device according to an embodiment of the present disclosure.
Figure 4:
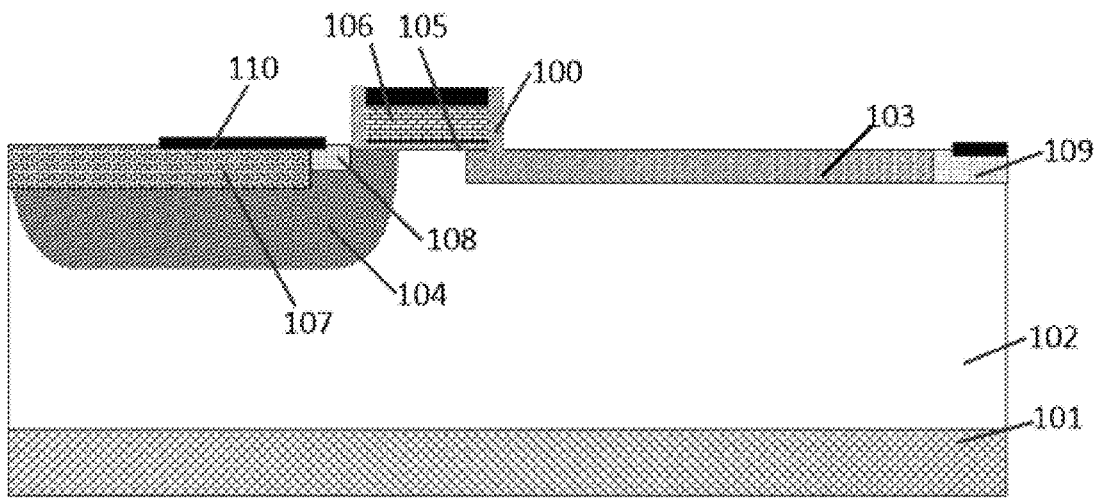
FIGS. 4-8 are structural schematic diagrams of steps of a manufacturing method of an RFLDMOS device according to an embodiment of the present disclosure.

FIG. 3 is a flow chart of a manufacturing method of an RFLDMOS device according to an embodiment of the present disclosure. As shown in FIG. 3, the following steps are included:

step 1: as shown in FIG. 4, a substrate 101 is provided, where an epitaxial layer 102 is arranged on the substrate 101, a drift region 103 and a body region 104 are arranged in the epitaxial layer 102; a drain region 109 is arranged in the drift region 103; a heavily doped region 107 and a source region 108 are arranged in the body region 103; a polysilicon gate is arranged on the surface of the epitaxial layer; a metal silicide 110 is arranged on the surface of the polysilicon gate, the source region 108 and the drain region 109.

In the embodiment of the present disclosure, the substrate 101 is N-type, or the substrate 101 is P-type. A P-type epitaxial layer grows on a P-type substrate, or an N-type epitaxial layer grows on an N-type substrate.

In the embodiment of the present disclosure, the body region 104 and the drift region 103 of the RFLDMOS device are respectively formed in the epitaxial layer 102 by a photolithographic process and an ion implantation process, the heavily doped region 107 and the source region 108 of the RFLDMOS are formed in the body region 104, and the drain region 109 of the RFLDMOS is formed in the drift region 103. The drain region 109 is located at an end of the drift region 103 away from the body region 104.

In the embodiment of the present disclosure, the polysilicon gate includes a gate oxide layer 105, a polysilicon 106 and a spacer 100.

In the embodiment of the present disclosure, the source region, the drain region and the polysilicon gate that need metal silicidation are opened, and a silicidation process is carried out. Of course, a metal silicide 110 also exists in other regions, such as the top of the heavily doped region 107 in the body region 104.

Step 2: a first layer of a dielectric layer 112 and a first layer of a Faraday shielding layer are deposited above the epitaxial layer 102 in sequence.

In the embodiment of the present disclosure, the first layer of a dielectric layer 112 is a silicon oxide layer. The first layer of a Faraday shielding layer is composed of a stack of a titanium metal layer, a titanium nitride layer and a tungsten metal layer.

Figure 5:
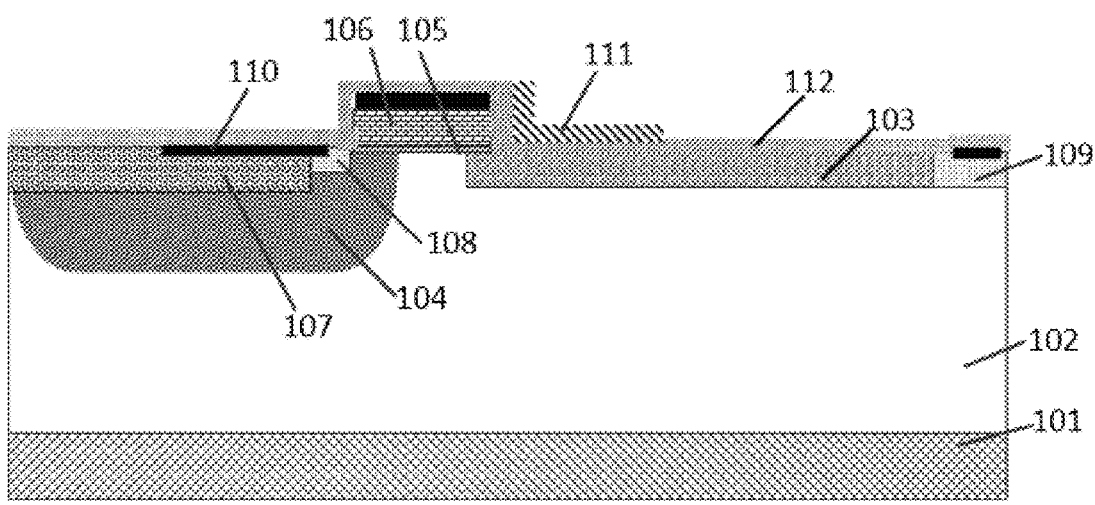

Step 3: as shown in FIG. 5, the first layer of a Faraday shielding layer is etched, by utilizing a photolithographic process and an etching process, to form the first layer of a Faraday shielding cover 111;

The first layer of a Faraday shielding cover 111 is formed by the following process: firstly, a pattern of the Faraday shielding cover is defined by utilizing the photolithographic process, and then a Faraday shielding cover structure is formed by utilizing the etching process to etch the Faraday shielding layer.

In the embodiment of the present disclosure, the first layer of a Faraday shielding cover 111 is located above the drift region 103 outside the side of the drain region 109 of the polysilicon gate and covers the side of the polysilicon gate. Of course, the first layer of a Faraday shielding cover 111 may be distributed in other ways, which may be set according to actual requirements, and not be limited by the embodiment of the present disclosure.

Figure 6:
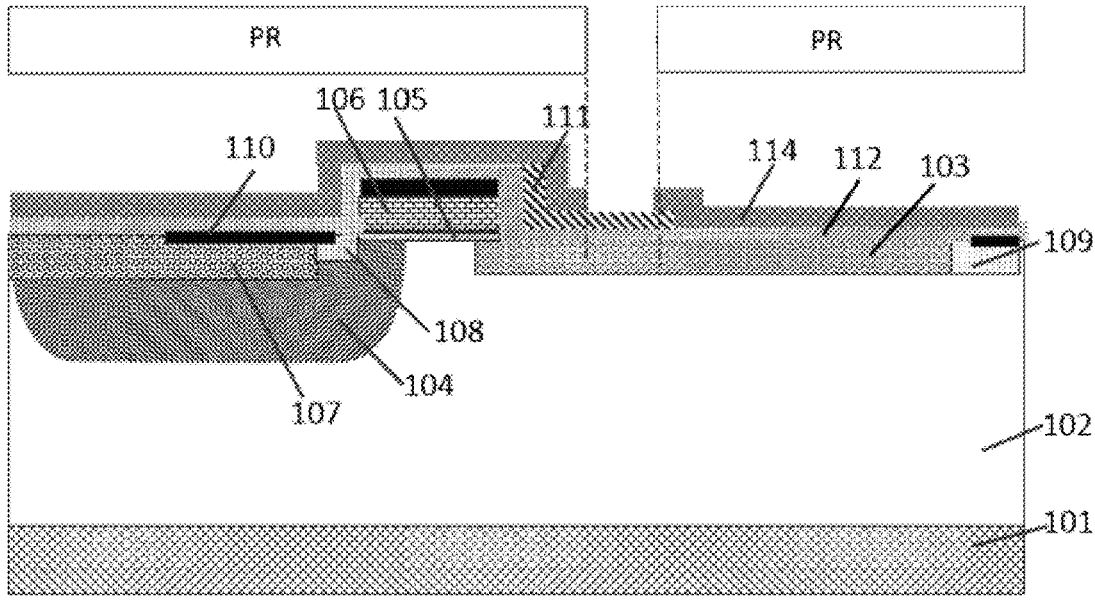

Step 4: as shown in FIG. 6, a second layer of a dielectric layer 114 is deposited, and part of the second layer of a dielectric layer 114 covering the first layer of a Faraday shielding cover 111 is removed by utilizing the photolithographic process and etching processes, so as to expose part of the first layer of a Faraday shielding cover 111.

In the embodiment of the present disclosure, a dry etching method is adopted to remove part of the second layer of a dielectric layer 114 above the first layer of a Faraday shielding cover 111, and the first layer of a Faraday shielding cover 111 is taken as an etching stop layer.

Figure 7:
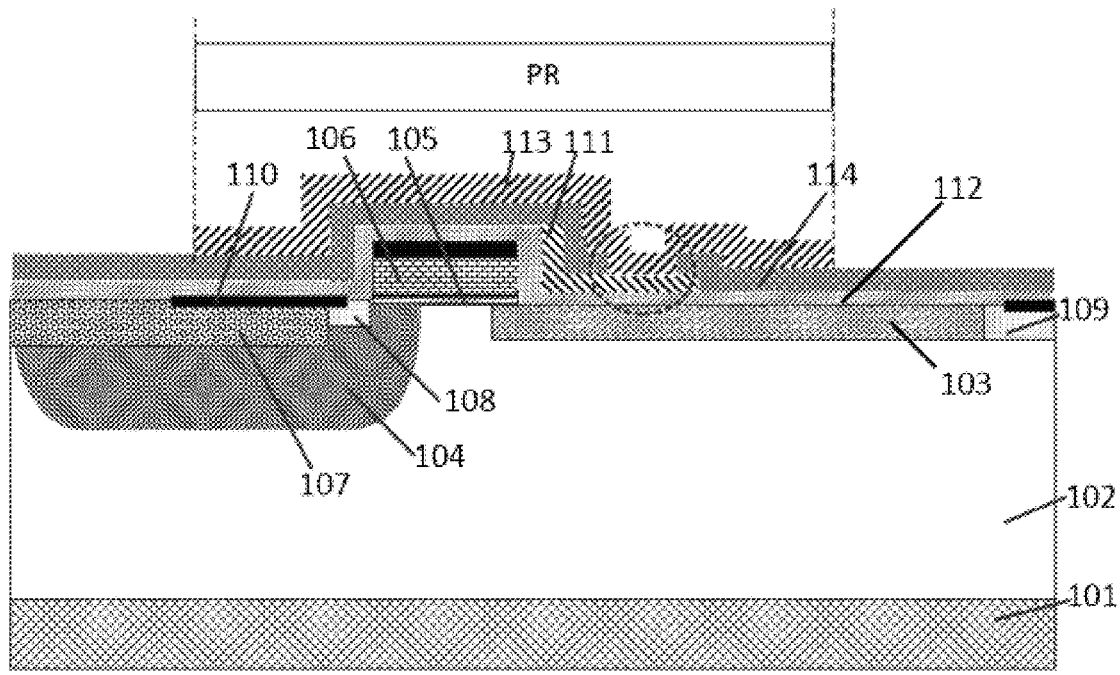

Step 5: as shown in FIG. 7, the second layer of a Faraday shielding layer is deposited, and a second layer of a Faraday shielding cover 113 is formed by utilizing the photolithographic process and etching processes, where the first layer of a Faraday shielding cover 111 and the second layer of a Faraday shielding cover 113 form an interconnection structure.

In the embodiment of the present disclosure, the second layer of a dielectric layer 114 is a silicon oxide layer. The second layer of a Faraday shielding layer is composed of a stack of a titanium metal layer, a titanium nitride layer and a tungsten metal layer.

The method for forming the second layer of a Faraday shielding cover 113 is as described in step 3 above, and is not repeatedly described herein. In the embodiment of the present disclosure, the second layer of a Faraday shielding cover 113 extends over the polysilicon gate to the upper side of part of the body region 104 and the drift region 103. Similarly, the second layer of a Faraday shielding cover 113 may be distributed in other ways, such as above the polysilicon gate near the drain region and above the drift region near the polysilicon gate.

Due to the etching and removal of part of the dielectric layers above the first layer of a Faraday shielding cover 111 in step 4, the subsequently formed second layer of a Faraday shielding cover 113 and the first layer of a Faraday shielding cover 111 are connected together to form an integral part and become an interconnected structure. The connected part is as shown by the dashed circle in FIG. 7.

The second layer of a Faraday shielding cover 113 and the first layer of a Faraday shielding cover 111 form an interconnection structure, so that a connection resistance of the Faraday shielding cover structure may be greatly reduced, the influence on a feedback capacitance is further reduced, and the efficiency, linearity and reliability of the device are improved.

Figure 8:
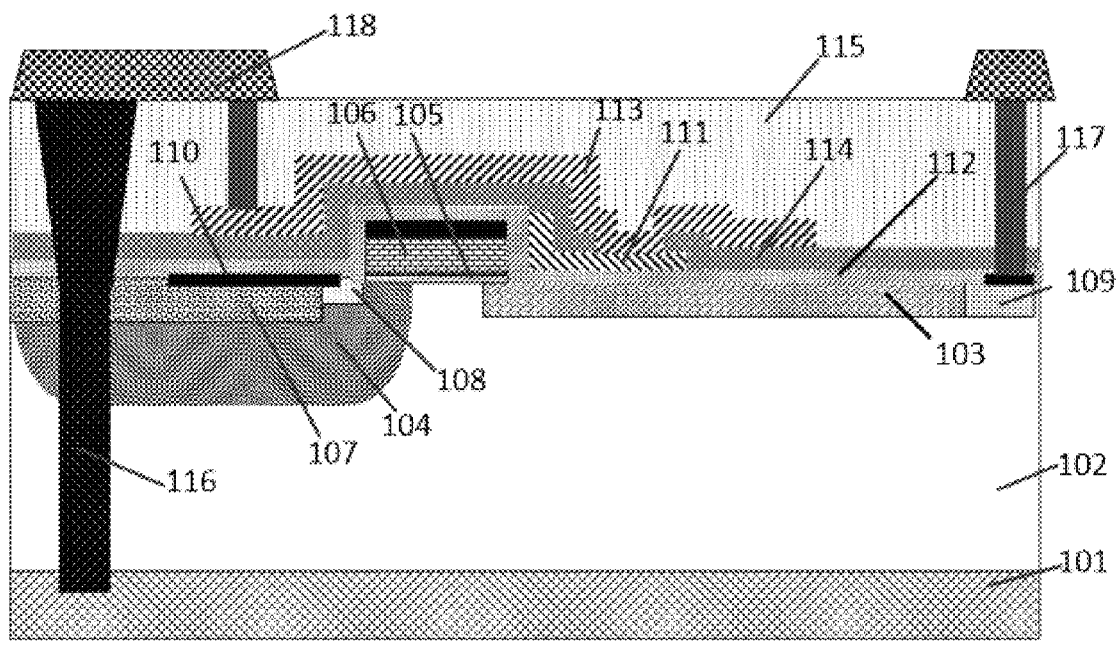

Step 6: as shown in FIG. 8, a metal front dielectric layer 115 is deposited, by photolithography and dry etching, the metal front dielectric layer 115 is opened, and the epitaxial layer 102 is further etched to form a deep trench, where the bottom of the deep trench is located in the substrate 101.

Step 7: as shown in FIG. 8, the contact hole is etched and metal tungsten is deposited to form a sinking channel 116 and the contact hole 117.

Step 8: as shown in FIG. 8, a first metal layer 118 is formed and etched, and connected with the contact hole 117 and the sinking channel 116.

Figure 9:
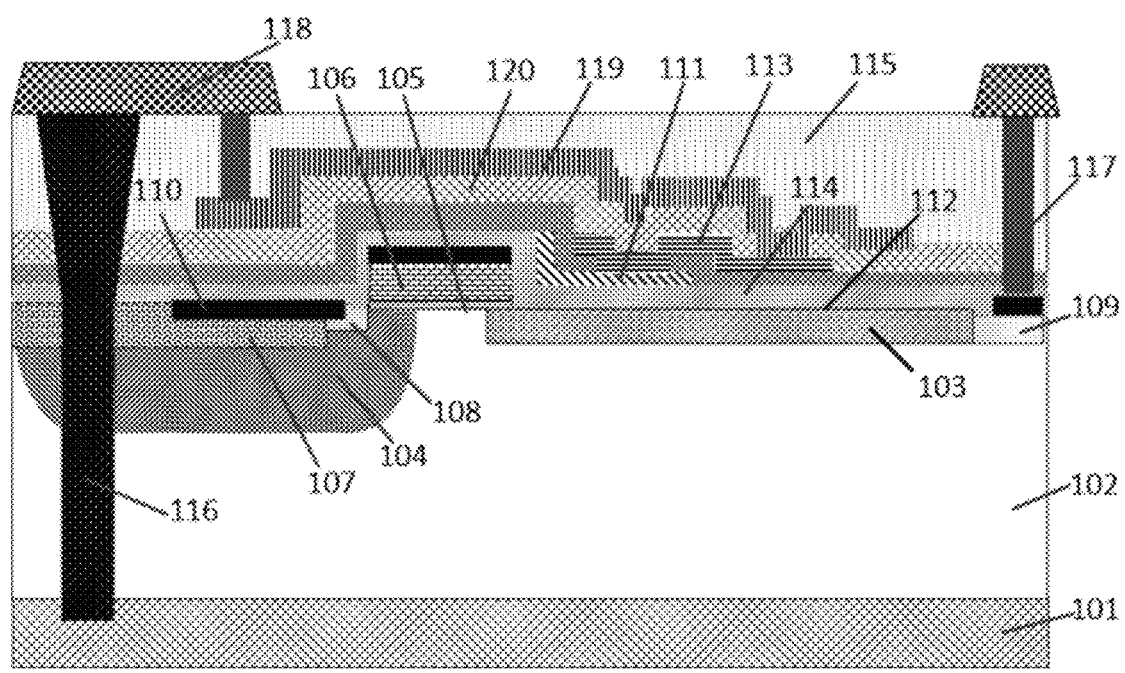
FIG. 9 is a structural schematic diagram of an RFLDMOS device having three layers of Faraday shielding covers according to an embodiment of the present disclosure.

According to the manufacturing method of the semiconductor device of the embodiment of the present disclosure, the method is also suitable for forming more than two layers of the Faraday shielding cover interconnection structure. As shown in FIG. 9, it is a structural schematic diagram of an RFLDMOS device having three layers of Faraday shielding covers;

Compared with the manufacturing method for conventional structural devices, the method adopted by the present disclosure may realize interconnection process of multiple layers of the Faraday shielding covers by only adding the etching process steps of the dielectric layers between the Faraday shielding covers, and has very high process value.

FIG. 8 is a structural schematic diagram of an RFLDMOS device according to an embodiment of the present disclosure. As shown in FIG. 8, the device includes the substrate 101; the epitaxial layer 102 over the substrate; the drift region 103 and the body region 104 arranged in the epitaxial layer 102; the drain region 109 arranged in the drift region 103; the heavily doped region 107 and the source region 108 arranged in body region 104; the polysilicon gate arranged from the upper right side of the source gate to the upper left side of the drift region; the metal silicide 110 arranged on the source region 108, the drain region 109, and the polysilicon gate; the Faraday shielding cover arranged above the polysilicon gate; the sinking channel 116; the contact hole 117; and the metal layer 118.

The doping concentration and thickness of the epitaxial layer 102 depend on a drain end operating voltage of the device. The higher the drain end operating voltage, the lower are the doping and the thicker the epitaxial layer 102. The body region 104 and the drift region 103 are laterally adjacent or separated by a certain distance. The polysilicon gate includes the gate oxide layer 105, the polysilicon 106 and the spacer 100. The metal silicide 110 is also formed above the body region 104. The sinking channel 116 is electrically connected with the source region 108, the body region 104, the epitaxial layer 102 and the substrate 101. The metal layer 118 is connected with the sinking channel 116 and the contact hole 117.

In the embodiment of the present disclosure, the Faraday shielding covers include upper and lower layers, the first layer of a Faraday shielding cover 111 is located above the right side of the polysilicon gate with the dielectric layer 112 therebetween; the second layer of a Faraday shielding cover 113 is located above the first layer of a Faraday shielding cover 111, and besides the isolated dielectric layer 114, an interconnection structure is also formed therebetween.

Compared with the conventional structure, the Faraday shielding cover interconnection structure in the embodiment of the present disclosure realizes the interconnection of the multiple layers of the Faraday shielding covers to form an ohmic contact, effectively reduces interconnection resistances of the Faraday shielding covers, reduces a resistance to ground of the device, improves the feedback capacitance and linearity of the RFLDMOS device at high frequencies, and enhances the broadband performance of the RFLDMOS device; moreover, the multiple layers of the Faraday shielding covers are interconnected, so that metal wiring is simpler, and the efficiency is improved.

It should be understood that many other layers may also exist, such as spacer elements and/or other suitable components, which are omitted from the figure for simplicity.

The above description is only the preferred embodiment of the invention and is not intended to limit the invention, and various modifications and changes may be made in the invention for those skilled in the art. Any modification, equivalent replacement, or improvement made within the spirit and principle of the invention should be inclusive in the protection scope of the invention.

What is claimed is:

1. A method for manufacturing an RFLDMOS device, comprising the following steps:
    step 1: providing a substrate, wherein an epitaxial layer is arranged on the substrate, and a drift region and a body region are arranged in the epitaxial layer; a drain region is arranged in the drift region; a heavily doped region and a source region are arranged in the body region; a polysilicon gate is arranged on the surface of the epitaxial layer; and a metal silicide is arranged on the surface of the polysilicon gate, the source region and the drain region;
    step 2: depositing, above the epitaxial layer, a first layer of a dielectric layer and a first layer of a Faraday shielding layer in sequence;
    step 3: etching, by utilizing a photolithographic and an etching process, the first layer of a Faraday shielding layer to form a first layer of a Faraday shielding cover;
    step 4: depositing a second layer of a dielectric layer, and removing, by utilizing the photolithographic and etching processes, part of the second layer of a dielectric layer covering the first layer of a Faraday shielding cover, so as to expose part of the first layer of a Faraday shielding cover;
    step 5: depositing a second layer of a Faraday shielding layer, and forming, by utilizing the photolithographic and etching processes, a second layer of a Faraday shielding cover, wherein the first layer of a Faraday shielding cover and the second layer of a Faraday shielding cover form an interconnection structure;
    step 6: depositing a metal front dielectric layer, opening, by photolithography and dry etching, the metal front dielectric layer, and further etching the epitaxial layer to form a deep trench, wherein the bottom of the deep trench is located in the substrate;
    step 7: etching a contact hole and depositing a metal to form a sinking channel and the contact hole; and
    step 8: forming and etching a first metal layer, and connecting with the contact hole and the sinking channel.

2. The method for manufacturing an RFLDMOS device according to claim 1, wherein the substrate in step 1 is N-type, or the substrate is P-type.

3. The method for manufacturing an RFLDMOS device according to claim 1, wherein the polysilicon gate in step 1 comprises a gate oxide layer, a polysilicon and a spacer.

4. The method for manufacturing an RFLDMOS device according to claim 1, wherein the first layer of a dielectric layer in step 2 and the second layer of a dielectric layer in step 4 are silicon oxides.

5. The method for manufacturing an RFLDMOS device according to claim 1, wherein the first layer of a Faraday shielding layer in step 2 and the second layer of a Faraday shielding layer in step 5 are composed of a stack of a titanium metal layer, a titanium nitride layer, and a tungsten metal layer.

6. The method for manufacturing an RFLDMOS device according to claim 1, wherein the first layer of a Faraday shielding cover in step 3 is located above the drift region outside the side of the drain region of the polysilicon gate and covers the side of the polysilicon gate.

7. The method for manufacturing an RFLDMOS device according to claim 1, wherein the second layer of a Faraday shielding cover in step 5 extends over the polysilicon gate to the upper side of part of the body region and the drift region.

8. The method for manufacturing an RFLDMOS device according to claim 1, wherein the metal deposited in the step 7 is tungsten.

9. The method for manufacturing an RFLDMOS device according to claim 1, wherein the method is also suitable for forming an RFLDMOS device having more than two layers of the Faraday shielding cover interconnection structures.

10. An RFLDMOS device formed by the method for manufacturing an RFLDMOS device according to claim 1, wherein the device comprises:
    a substrate;
    an epitaxial layer located above the substrate; wherein a drift region and a body region are arranged in the epitaxial layer; a drain region is arranged in the drift region, a heavily doped region and a source region are arranged in the body region, and the heavily doped region is connected with the source region;
    a polysilicon gate located on the surface of the epitaxial layer, wherein the polysilicon gate includes a gate oxide layer, a polysilicon, and a spacer;
    a metal silicide on the surface of the source region, the drain region and the polysilicon gate;
    faraday shielding covers;

a sinking channel and a contact hole, wherein the bottom of the sinking channel is located in the substrate and penetrates through the body region and the epitaxial layer; and a first metal layer connected with the sinking channel and the contact hole;

wherein the Faraday shielding covers are located above the polysilicon gate and are divided into upper and lower layers, and a first layer of a Faraday shielding cover is located above the polysilicon gate, with a dielectric layer therebetween; a second layer of a Faraday shielding cover is located above the first layer of a Faraday shielding cover, and besides an isolated dielectric layer, an interconnection structure is also formed therebetween.

* * * * *